United States Patent
Hara

(10) Patent No.: US 11,656,816 B2
(45) Date of Patent: May 23, 2023

(54) APPARATUS, METHOD OF CONTROLLING APPARATUS, AND STORAGE MEDIUM FOR OVERWRITING STORED DATA WITH DIFFERENT DATA

(71) Applicant: CANON KABUSHIKI KAISHA, Tokyo (JP)

(72) Inventor: Kenji Hara, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 21 days.

(21) Appl. No.: 17/358,946

(22) Filed: Jun. 25, 2021

(65) Prior Publication Data
US 2022/0004343 A1 Jan. 6, 2022

(30) Foreign Application Priority Data
Jul. 1, 2020 (JP) .............................. JP2020-114215

(51) Int. Cl.
| | |
|---|---|
| *G06F 12/00* | (2006.01) |
| *G06F 3/12* | (2006.01) |
| *H04N 1/21* | (2006.01) |
| *G11C 16/14* | (2006.01) |
| *G06F 3/06* | (2006.01) |
| *G11C 16/04* | (2006.01) |

(52) U.S. Cl.
CPC ............ *G06F 3/122* (2013.01); *G06F 3/0623* (2013.01); *G06F 3/0652* (2013.01); *G06F 3/0679* (2013.01); *G06F 3/1222* (2013.01); *G06F 3/1229* (2013.01); *G06F 3/1274* (2013.01); *G11C 16/14* (2013.01); *H04N 1/21* (2013.01); *G11C 16/0483* (2013.01)

(58) Field of Classification Search
CPC .... G06F 3/0623; G06F 3/0652; G06F 3/0679; G06F 3/1222; G06F 3/1229; G06F 3/1274
See application file for complete search history.

(56) References Cited

U.S. PATENT DOCUMENTS

2015/0347025 A1* 12/2015 Law ........................ G06F 3/061 711/103
2019/0214092 A1* 7/2019 Jang .................... G11C 11/5642

FOREIGN PATENT DOCUMENTS

JP 2013236338 A 11/2013

* cited by examiner

*Primary Examiner* — Gurtej Bansal
(74) *Attorney, Agent, or Firm* — Canon U.S.A., Inc. IP Division

(57) ABSTRACT

An apparatus that includes a non-volatile semiconductor storage apparatus includes a controller configured to make a setting of an erase-by-overwriting function of issuing an instruction to erase data stored in the semiconductor storage apparatus by overwriting the stored data with different data, wherein, in a case where the semiconductor storage apparatus satisfies a predetermined condition, the controller enables the setting of the erase-by-overwriting function to be made, and wherein, in a case where the semiconductor storage apparatus does not satisfy the predetermined condition, the controller disables the setting of the erase-by-overwriting function to be made.

17 Claims, 13 Drawing Sheets

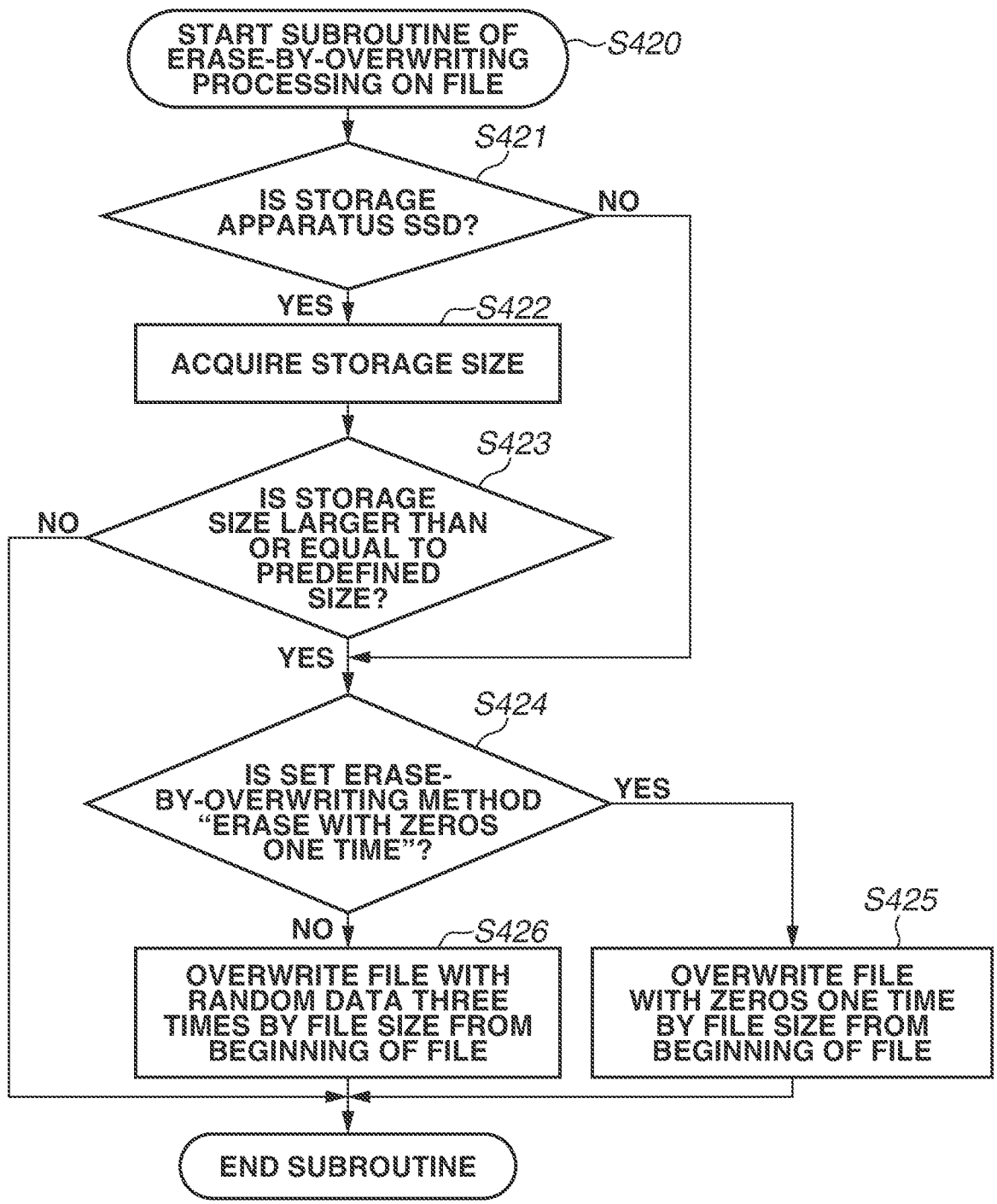

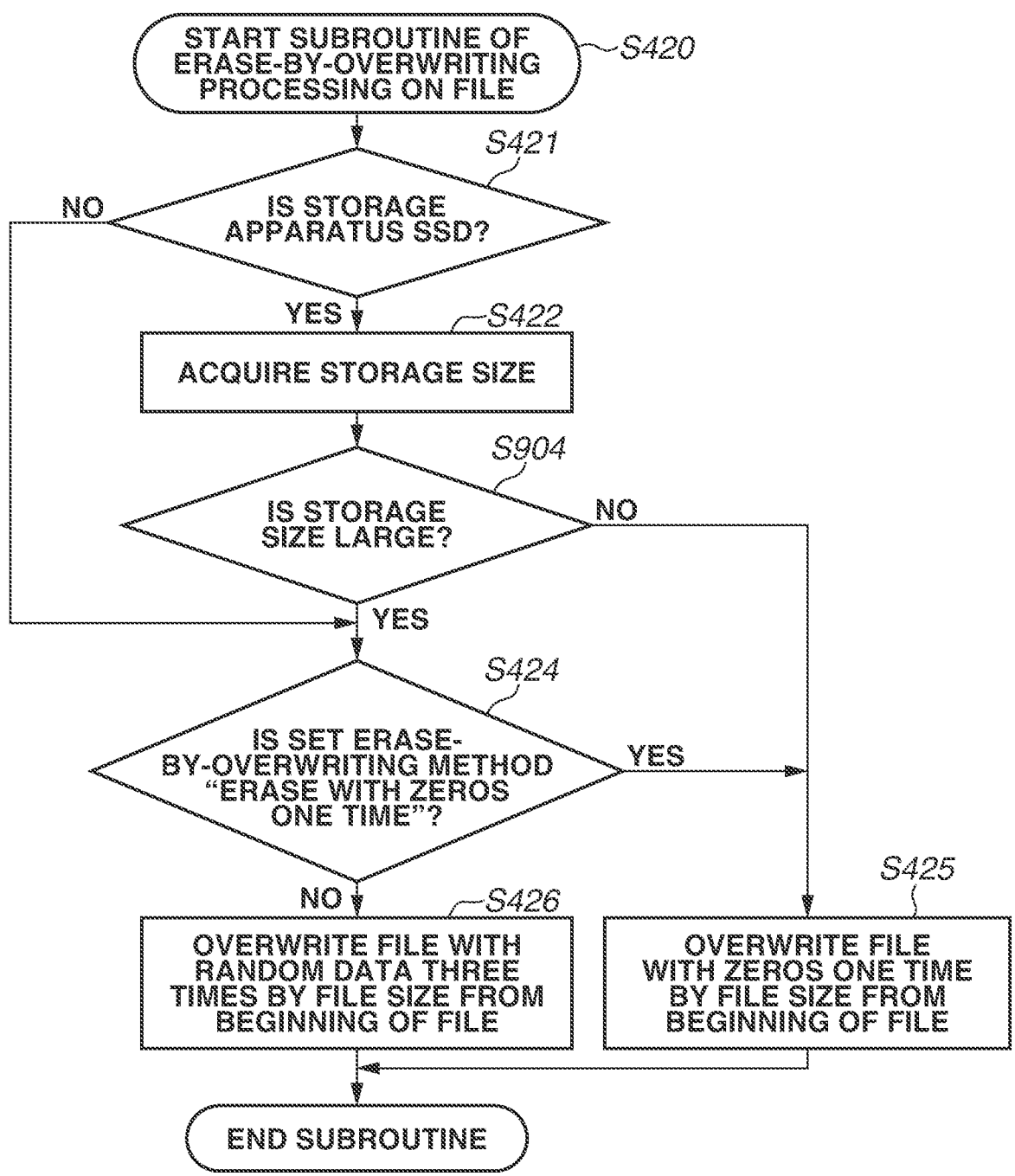

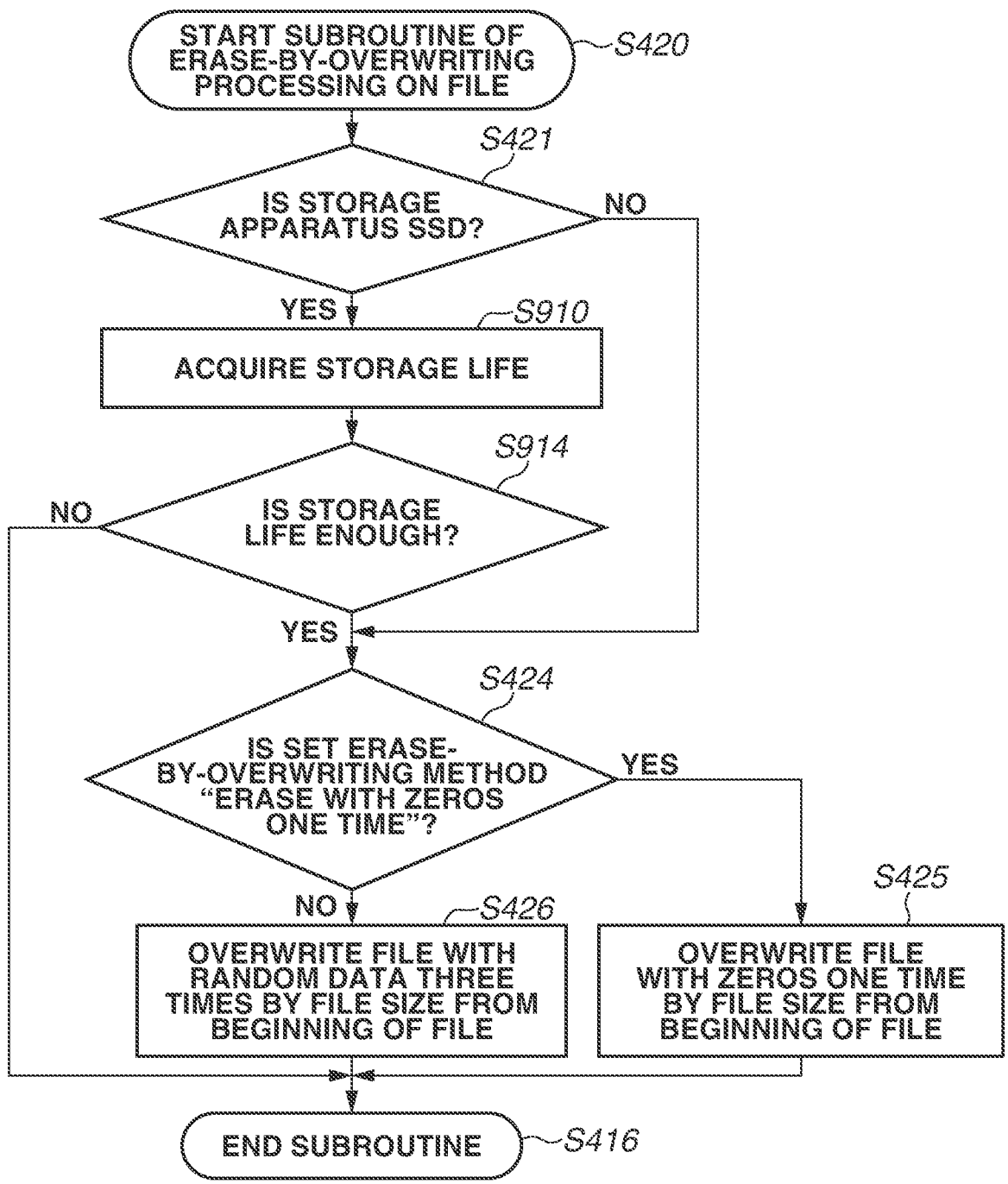

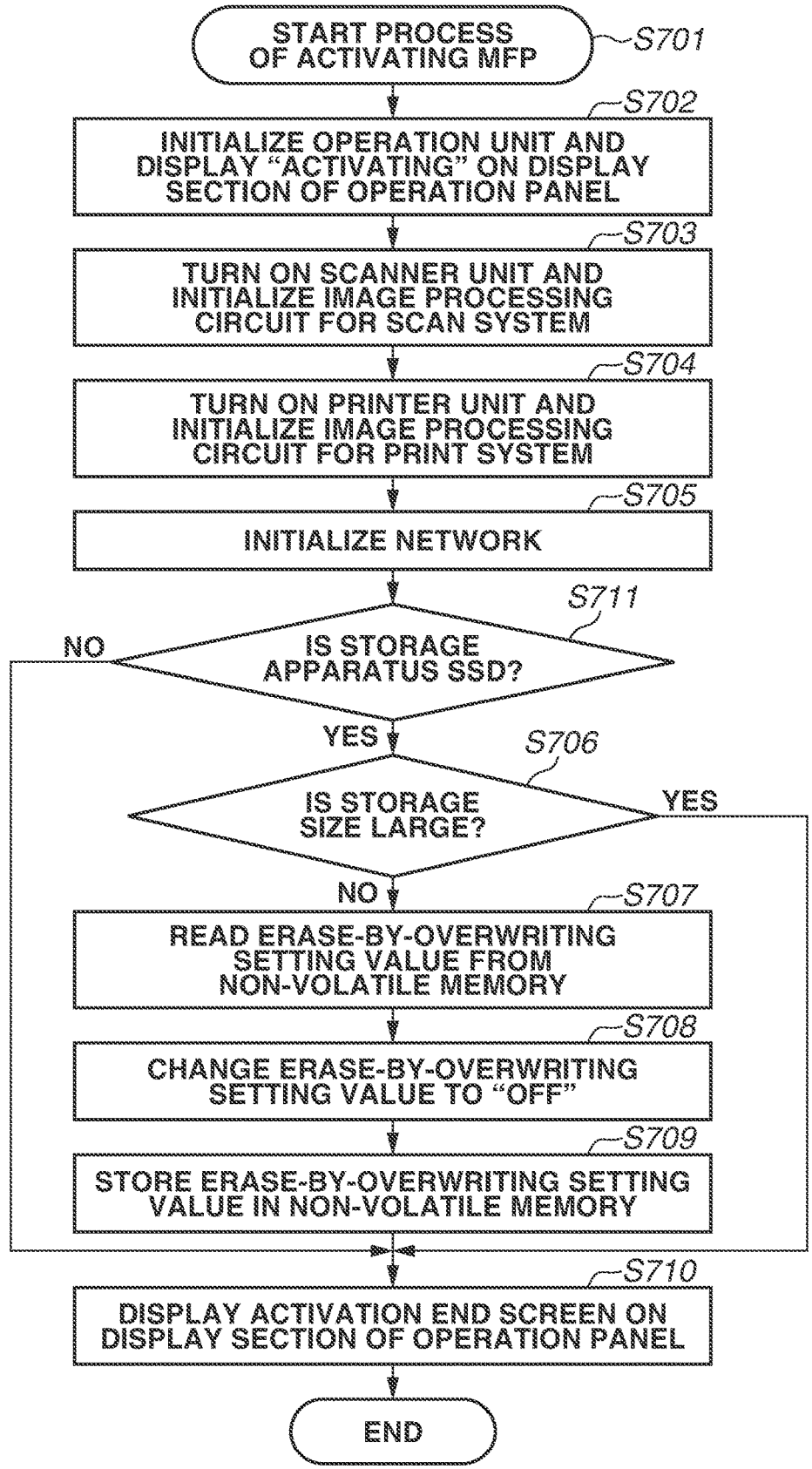

APPARATUS, METHOD OF CONTROLLING APPARATUS, AND STORAGE MEDIUM FOR OVERWRITING STORED DATA WITH DIFFERENT DATA

BACKGROUND OF THE DISCLOSURE

Field of the Disclosure

The aspect of the embodiments relates to an apparatus, a method of controlling an apparatus, and a storage medium.

Description of the Related Art

A storage control apparatus performs "file creation" in a case where data is stored on a storage apparatus and performs "file deletion" in a case where the data is deleted.

However, when the storage control apparatus performs "file deletion" to delete the data, the data is deleted from a file management area of the storage apparatus. In other words, a real data area of the file is not erased and remains recorded on the storage apparatus. Thus, it has been commonly known that there is a method of retrieving the real data of the file by the storage control apparatus directly accessing the real data area afterwards.

Since an image forming apparatus may be used by many and unspecified persons depending on where the image forming apparatus is situated, for example, the image forming apparatus has an erase-by-overwriting function to eliminate concerns associated with remaining of temporary data used in copying in the image forming apparatus.

For example, Japanese Patent Application Laid-Open No. 2013-236338 discusses an image processing apparatus that has an erase function. Specifically, temporary data stored in a hard disk drive (HDD) is erased by overwriting the temporary data in a real data area with real data after a job is performed.

This method of erasing a file by overwriting data in a data area of the file with a data string of a specific pattern will be referred to as an erase-by-overwriting method in the present specification.

In recent years, an information processing apparatus that includes a non-volatile semiconductor storage apparatus such as a solid-state drive (SSD) has been increasing in number. The SSD has a write life. In order to extend the life of the SSD, it is desirable to employ wear leveling. Wear leveling is a technique for evenly consuming a life of an internal semiconductor storage element (hereinafter, referred to as a storage element) to extend the life of the SSD. In wear leveling, an erase-by-overwriting processing is performed on a file, but it is not guaranteed that data is written to the same location on the storage element of the SSD.

Specifically, it is generally considered that when the erase-by-overwriting processing is performed, technically data at a location different from a storage location of original data may be erased in an SSD, unlike a HDD, and thus there is no guarantee that the original data is erased by the overwriting. Thus, when the erase-by-overwriting processing is performed on an information processing apparatus that includes an SSD, the write life of the SSD is consumed although there is no guarantee that target data is erased. There are known information processing apparatuses that do not enable the erase-by-overwriting processing in a case where an SSD is detected. This prevents wasteful consumption of the life of the SSD.

SUMMARY OF THE DISCLOSURE

According to an aspect of the embodiments, an apparatus that includes a non-volatile semiconductor storage apparatus includes a controller configured to make a setting of an erase-by-overwriting function of issuing an instruction to erase data stored in the semiconductor storage apparatus by overwriting the stored data with different data, wherein, in a case where the semiconductor storage apparatus satisfies a predetermined condition, the controller enables the setting of the erase-by-overwriting function to be made, and wherein, in a case where the semiconductor storage apparatus does not satisfy the predetermined condition, the controller disables the setting of the erase-by-overwriting function to be made.

Further features of the disclosure will become apparent from the following description of exemplary embodiments with reference to the attached drawings.

BRIEF DESCRIPTION OF THE DRAWINGS

FIGS. 5A and 5B are flowcharts illustrating a process executed by a central processing unit (CPU) according to a first exemplary embodiment.

FIGS. 7A, 7B, and 7C are flowcharts each illustrating an erase-by-overwriting method.

FIG. 10 illustrates a sequence of activating an image forming apparatus.

DESCRIPTION OF THE EMBODIMENTS

Figure 1:
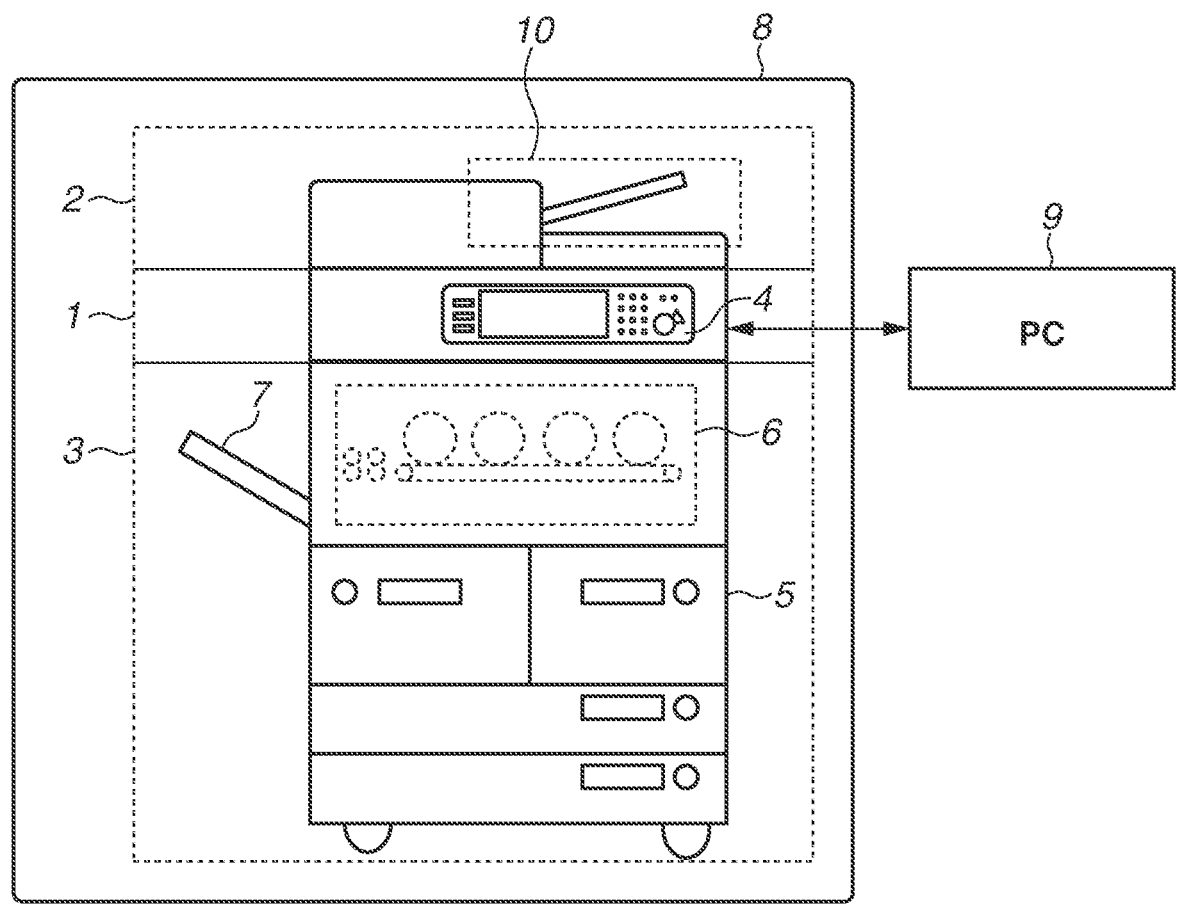
FIG. 1 is a diagram illustrating an image forming apparatus used in an exemplary embodiment.

Elements of one embodiment may be implemented by hardware, firmware, software or any combination thereof. The term hardware generally refers to an element having a physical structure such as electronic, electromagnetic, optical, electro-optical, mechanical, electro-mechanical parts, etc. A hardware implementation may include analog or digital circuits, devices, processors, applications specific integrated circuits (ASICs), programmable logic devices (PLDs), field programmable gate arrays (FPGAs), or any electronic devices. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory, ROM, EROM). Examples of firmware may include microcode, writable control store, micro-programmed structure.

When implemented in software or firmware, the elements of an embodiment may be the code segments to perform the necessary tasks. The software/firmware may include the actual code to carry out the operations described in one embodiment, or code that emulates or simulates the operations. The program or code segments may be stored in a processor or machine accessible medium. The "processor readable or accessible medium" or "machine readable or accessible medium" may include any non-transitory medium that may store information. Examples of the processor readable or machine accessible medium that may store include a storage medium, an electronic circuit, a semiconductor memory device, a read only memory (ROM), a flash memory, an erasable programmable ROM (EPROM), a floppy diskette, a compact disk (CD) ROM, an optical disk, a hard disk, etc. The machine accessible medium may be embodied in an article of manufacture. The machine accessible medium may include information or data that, when accessed by a machine, cause the machine to perform the operations or actions described above. The machine accessible medium may also include program code, instruction or instructions embedded therein. The program code may include machine readable code, instruction or instructions to perform the operations or actions described above. The term "information" or "data" here refers to any type of information that is encoded for machine-readable purposes. Therefore, it may include program, code, data, file, etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

Exemplary embodiments of the disclosure will be described below with reference to the attached drawings. In the exemplary embodiments, an image forming apparatus will be described as an example of an information processing apparatus. The exemplary embodiments described below are not intended to limit the scope of the claimed invention, and not every combination of features described in the exemplary embodiments is always essential to a technical solution of the disclosure.

[Configuration of Image Forming Apparatus]

FIG. 1 is a block diagram illustrating a configuration of an entire image forming apparatus according to a first exemplary embodiment. FIG. 1 illustrates an example of an entire image of an image forming apparatus 8. The image forming apparatus 8 includes a scanner unit 2, a controller unit 1, and a printer unit 3. The scanner unit 2 is an image reading engine. The controller unit 1 controls the entire image forming apparatus 8. The printer unit 3 is an image output engine. Details of each of the units will be described below.

The controller unit 1 includes a front surface that includes an operation unit 4 to be operated by a user. The scanner unit 2 is an image reading engine, and the printer unit 3 is an image output engine. The controller unit 1 includes a user interface and comprehensively controls the scanner unit 2 and the printer unit 3. The image forming apparatus 8 includes the scanner unit 2, the controller unit 1, and the printer unit 3.

The scanner unit 2 includes an auto document feeder (ADF) unit 10. For example, the user places a document on the ADF unit 10 and inputs a copy instruction via the operation unit 4. Based on the copy instruction, the scanner unit 2 sequentially reads the documents and generates image data.

The printer unit 3 includes a sheet cassette 5, an electrophotographic processing unit 6, and a sheet discharge tray 7. In the printer unit 3, the sheet cassette 5 sequentially feeds sheets, and the electrophotographic processing unit 6 copies read image data and fixes the copied image data to the sheets. Then, the copied print materials are sequentially discharged onto the sheet discharge tray 7, and copying ends.

[Outline of Print Operation]

The image forming apparatus 8 receives a print job from a personal computer (PC) 9 via a network. The PC 9 transmits the print job described in a page description language to the controller unit 1. A print job is a job that includes at least a print setting and print data. The controller unit 1 analyzes the received print data and converts the print data into a printable bitmap format. Then, the printer unit 3 feeds a sheet from the sheet cassette 5, generates a print material and fixes the print material at the electrophotographic processing unit 6, and discharges the print material onto the sheet discharge tray 7. Thus, the print operation ends.

[Detailed Configuration of Image Forming Apparatus 8 According to Present Exemplary Embodiment]

Figure 2:
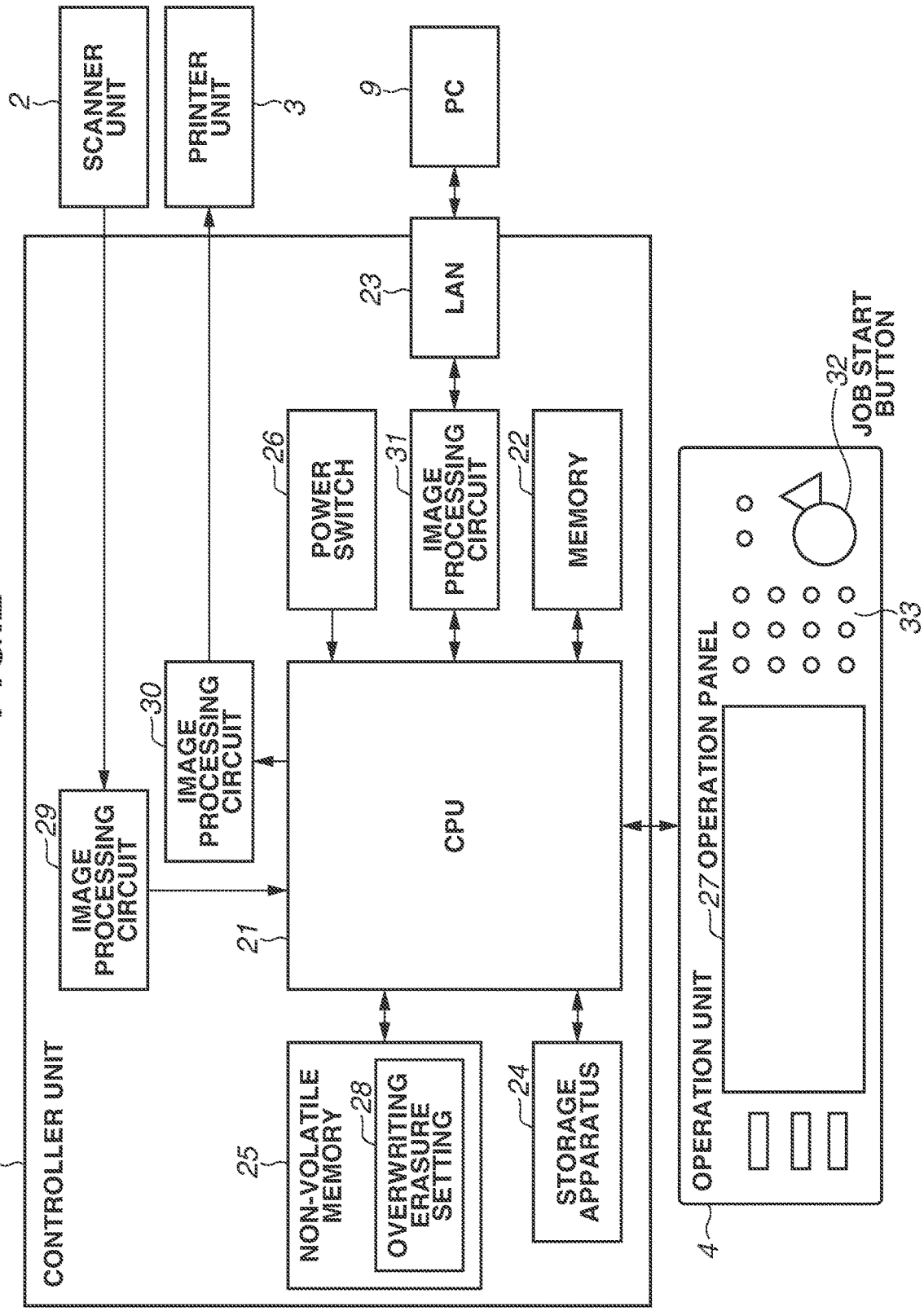
FIG. 2 is a block diagram illustrating a configuration of a controller unit.

FIG. 2 is a block diagram illustrating a configuration of the controller unit 1.

The controller unit 1 includes a power switch 26, an image processing circuit 31, a memory 22, a central processing unit (CPU) 21, a local area network (LAN) 23, an image processing circuit 30, an image processing circuit 29, a non-volatile memory 25, and a storage apparatus 24.

The power switch 26 is a switch for turning on and off the image forming apparatus 8. The storage apparatus 24 is a non-volatile semiconductor storage apparatus (e.g., solid state drive (SSD)) capable of storing image data. The non-volatile memory 25 stores setting information such as an erase-by-overwriting setting and a program for activation of the image forming apparatus 8. The CPU 21 is a control unit that controls the components. The memory 22 is a volatile memory that temporarily stores information that the CPU 21 is to operate.

At the time of activation of the image forming apparatus 8, the CPU 21 boots from the non-volatile memory 25 and initializes a storage controller (not illustrated) to enable access to the storage apparatus 24. Consequently, the image forming apparatus 8 is activated and enters a state in which the user can operate. Further, the CPU 21 controls the operation unit 4, which is operated by a user, the scanner unit 2, and the printer unit 3.

The operation unit 4 includes an operation panel 27 (display section) including a liquid crystal display (LCD) screen and a touch panel attached to the LCD screen.

The operation panel 27 has a role of displaying information to notify the user of the information and a role of displaying bitmaps of operable buttons. The bitmapped buttons can be pressed by the user, and various types of buttons can be drawn as suitable for various situations.

A numeric keypad 33 includes physically-pressable buttons for numbers, which are frequently used. A job start button 32 is an object that is pressed to start a job. A job is started by pressing the job start button 32 regardless of what is displayed on the operation panel 27. In a case where the operation panel 27 is a touch panel, the numeric keypad 33 and the job start button (object) 32 can be displayed on the touch panel.

[Outline of Copy Operation]

An outline of a copy operation will be described below. The user transitions a screen on the operation unit 4 to a copy function screen (not illustrate) and performs all settings thereon. The settings include, for example, settings that relate to the scanner unit 2, such as a setting as to whether to read two sides, and settings that relate to the printer unit 3, such as a color/monochrome print setting and a two-sided/one-side print setting.

If the user performs the settings and presses the job start button 32, the CPU 21 issues an instruction to read a document image to the scanner unit 2. The image processing circuit 29 removes individual characteristics of the scanner unit 2 from read image data and converts the resulting image data to be represented in a color space that is determined as a standard color space. The image data converted into a standard image format is temporarily stored in the memory 22 and is then stored in the storage apparatus 24 as needed.

After the printer unit 3 is prepared, the image data accumulated in the storage apparatus 24 is read into the memory 22, and the read image data is transmitted to the printer unit 3. At this time, the image processing circuit 30 performs image processing on the image data taking into consideration characteristics of the printer unit 3 so that a suitable image is output after printing.

As described above, a scan job of sequentially storing scanned image data in the storage apparatus 24 and a print job of sequentially issuing an instruction to print the stored images to the printer unit 3 work together to execute a copy job.

[Operation in Network Transmission Job]

An operation of a network transmission job of transmitting data to the PC 9 will be described below. The user transitions a screen on the operation unit 4 to a network transmission function screen (not illustrated) and performs all settings thereon.

The settings include, for example, settings that relate to the scanner unit 2, such as a color/monochrome scan setting and a two-sided/one-side scan setting. The user also performs settings of image processing performed after scanning, such as a destination setting, a resolution setting, and a setting about the presence/absence of optical character recognition (OCR).

If the user performs the settings and presses the job start button 32, the CPU 21 issues an instruction to read a document image to the scanner unit 2. The image processing circuit 29 removes individual characteristics of the scanner unit 2 from read image data and converts the resulting image data to be represented in a color space that is determined as a standard color space. The image data converted into a standard image format is temporarily stored in the memory 22 and is then stored in the storage apparatus 24 as needed.

Simultaneously with the scan processing, the CPU 21 converts the image data read from the storage apparatus 24 into an appropriate format for use in the PC 9 using the image processing circuit 31, temporarily stores the converted image data in the memory 22, and transmits the image data to the PC 9 via the LAN 23.

At this time, a resolution suitable for use in the printer unit 3 and a display resolution of the PC 9 are significantly different, so that the image processing circuit 29 performs a resolution conversion for use in the PC 9 and a conversion of a standard color space such as the National Television System Committee (NTSC) on the PC 9.

[Operation of File to Storage and Erase-by-Overwriting Processing]

In the copy job, the print job, and the transmission job that are described above, the CPU 21 writes image data to the storage apparatus 24 and reads the written image data from the storage apparatus 24 to perform processing corresponding to the job.

A reason for writing the image data to the storage apparatus 24 is to implement electronic sorting. For example, in a copy job of generating a plurality of copies of a single document, after a first scan of the document is performed, printing of second and subsequent copies is performed by reading the image data stored in the storage apparatus 24 and printing the read image data so that a second scan is unnecessary. Further, for example, in a case where a scan speed and a print speed are different, image data is stored in the storage apparatus 24 until all scan images are printed so that less space of the memory 22 is used.

Figure 3:
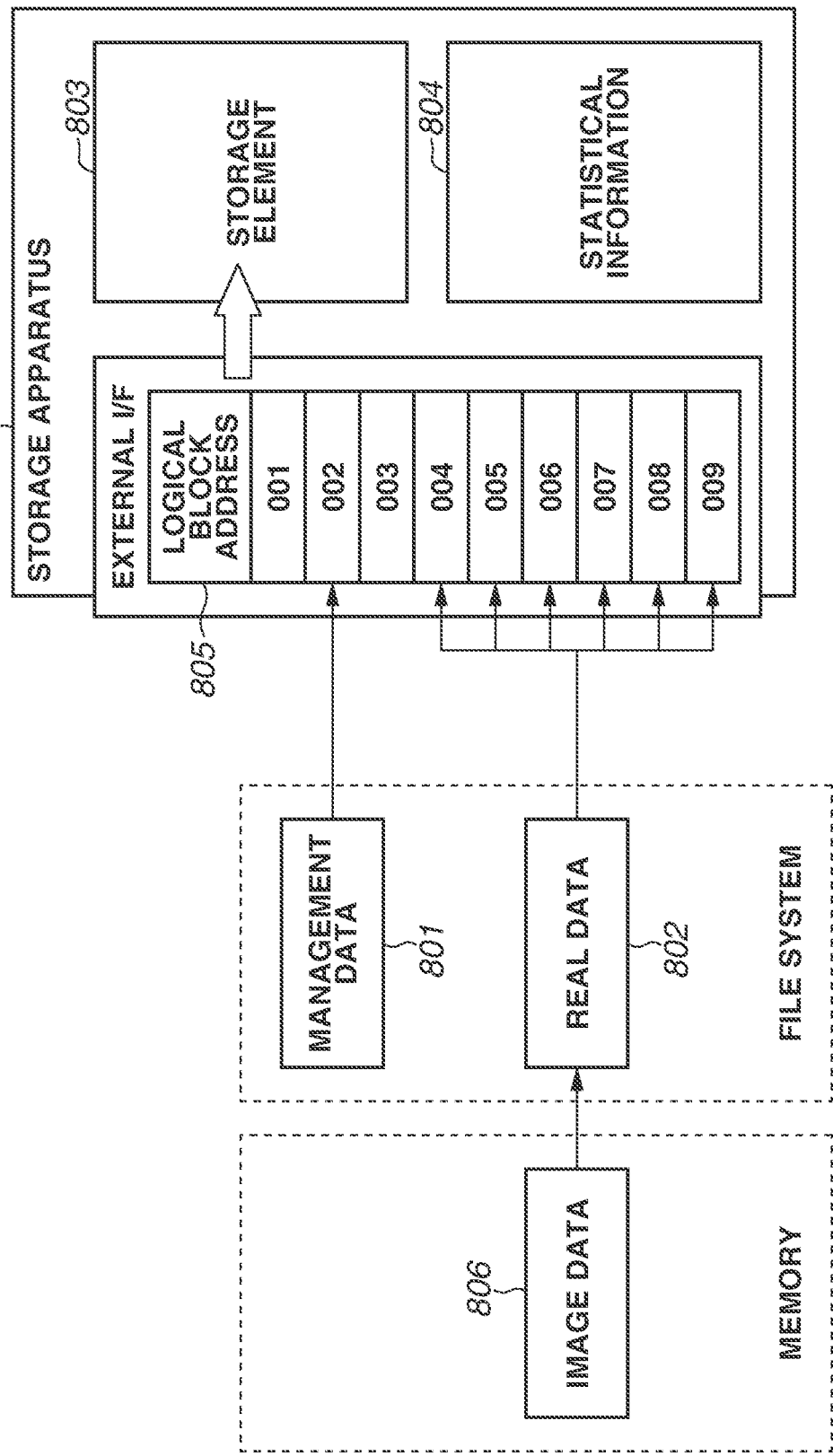
FIG. 3 is a block diagram illustrating details of data written to a storage.

FIG. 3 illustrates details of a case where information such as image data is stored in the storage apparatus 24.

In general, a file system is used in writing image data 806 to the storage apparatus 24. The file system is executed by the CPU 21.

The storage apparatus 24 can write the image data 806 by directly designating a sector number (logical block address (LBA)) that is an external interface (external I/F). However, since only data can be stored and the data cannot be stored with a name such as a file name, the data is to be managed by a system other than the name. The file system is a system for facilitating handling of data in a computer. The file system enables the data to be handled as a file.

In the present exemplary embodiment, a case where the file system is used is described. In storing data, the data to be stored is referred to as real data 802. Data that is generated to be added in managing a file by the file system is referred to as management data 801. The management data 801 is also referred to as metadata.

Data is read from and written to the storage apparatus 24 via the external I/F. In general, a storage location is designated using a LBA 805 to write data to the designated location. In FIG. 3, the storage apparatus 24 stores the management data 801 in a LBA 0002 and the real data 802 in LBAs 0004 to 0009. The pieces of data are stored in a storage element 803, and in a case where the current remaining life decreases due to writes, statistical information 804 is updated.

In reading the image data 806, the CPU 21 reads the management data 801 of a file corresponding to an image from the LBA 0002 to find out that the real data 802 is stored in the storage area corresponding to the LBAs 0004 to 0009. Then, the CPU 21 can retrieve the image data 806 by reading data from the LBAs 0004 to 0009.

In erasing the image data 806, the CPU 21 normally erases only the management data 801 of the file corresponding to the image from the LBA 0002. The CPU 21 stores information indicating that the LBAs 0004 to 0009 are unused by the file system, and next time the CPU writes something, the LBAs 0004 to 0009 can be reused at a timing of use.

Specifically, in a case where the CPU 21 merely deletes the file, i.e., only the management data 801 is erased, the real data 802 in the storage apparatus 24 remains in the storage area corresponding to the LBAs 0004 to 0009. Then, in a case where a third party that desires to retrieve the information directly designates the LBAs 0004 to 0009 of the LBA 805 and reads data from the storage apparatus 24, the third party can retrieve the image data 806.

In order to prevent this situation, the CPU 21 transmits an erase instruction to the storage apparatus 24 to erase the real data 802. Specifically, before deleting the management data 801, the CPU 21 issues an erase instruction to, for example, write zeros to all areas of the LBAs 0004 to 0009 of the real data 802. Consequently, the image data 806 can no longer be retrieved by designating the LBAs 0004 to 0009 of the external I/F of the storage apparatus 24. Such an erasing operation is referred to as an erase-by-overwriting processing of a file in the present exemplary embodiment.

In a case where the storage element 803 is a NAND process (e.g., SSD), wear leveling is available. Wear leveling is a technique for changing a physical location to write data in order to level element deteriorations. With this technique, there may be a case where the real data 802 stored in the storage element 803 is not erased although erase-by-overwriting processing is performed. However, the LBAs 0004 to 0009 associated with the real data 802 are overwritten via the external I/F so that different data is associated with the LBAs 0004 to 0009. This makes it impossible to read the real data 802 by designating the LBAs 0004 to 0009. Specifically, data cannot be retrieved from the storage apparatus 24, so that this is also referred to as the erase-by-overwriting processing in the present exemplary embodiment.

Further, there is a case where a notification of unused is provided using a TRIP command to the LBAs 0004 to 0009, which are a storage location of the real data 802, when the file system deletes the file. This is a notification of unused, and what processing is to be performed depends on the specifications of the storage apparatus 24. This is not included in the erase-by-overwriting processing according to the present exemplary embodiment.

Similarly, there is a file system that performs erasing using a Secure TRIM command, but this also is not included in the erase-by-overwriting processing according to the present exemplary embodiment.

Figure 4:
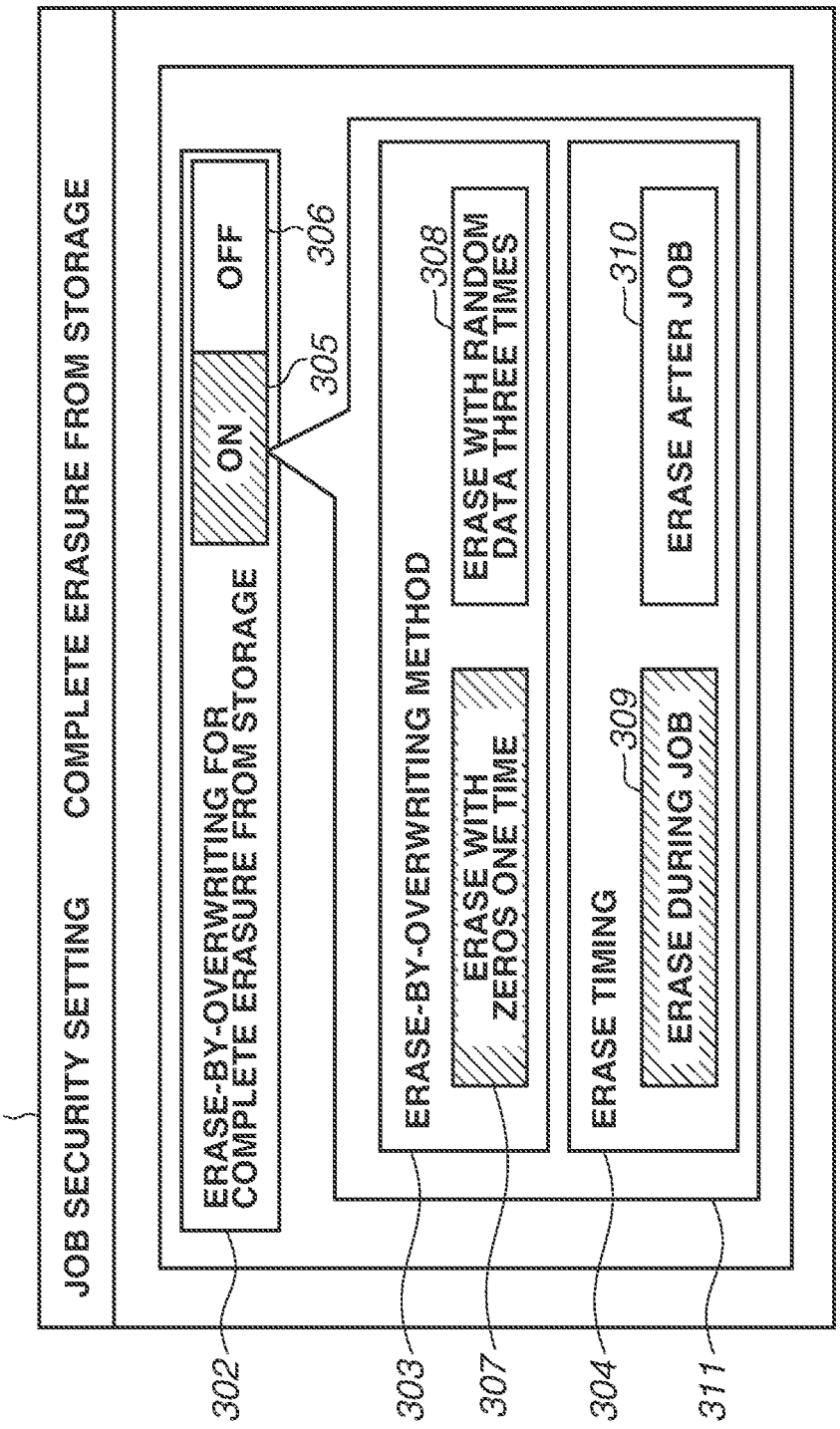
FIG. 4 illustrates an erase-by-overwriting setting screen.

FIG. 4 illustrates an erase-by-overwriting setting screen of the image forming apparatus 8.

In order to access a security setting of the image forming apparatus 8, a user operates the operation panel 27 and logs in in an administrator mode. After an administrator of the image forming apparatus 8 logs in, the administrator moves to a security setting hierarchical layer and presses a JOB SECURITY SETTING button to display the erase-by-overwriting setting screen illustrated in FIG. 4.

In FIG. 4, a setting of whether to enable an erase-by-overwriting function 302 on the storage apparatus 24 can be performed. If a user selects an ON button 305, the erase-by-overwriting function 302 is enabled, whereas if the user selects an OFF button 306, the erase-by-overwriting function 302 is disabled.

In a case where the OFF button 306 is selected to disable the erase-by-overwriting function 302 on the storage apparatus 24, only the LBA 0002 storing the management data 801 is erased when the file is deleted without performing the erase-by-overwriting processing.

In a case where the ON button 305 is selected to enable the erase-by-overwriting function 302 on the storage apparatus 24, a setting of an item 311 is enabled. In the item 311, options for an erase-by-overwriting method 303 and an erase timing 304 are selectable.

In a case where an ERASE WITH ZEROS ONE TIME button 307 is selected as the erase-by-overwriting method 303, the CPU 21 writes data consisting of zeros to the LBAs 0004 to 0009 one time. In a case where an ERASE WITH RANDOM DATA THREE TIMES button 308 is selected as the erase-by-overwriting method 303, the CPU 21 writes random data to the LBAs 0004 to 0009 three times.

Further, in a case where an ERASE DURING JOB button 309 is selected as the erase timing 304, a job is executed using the LBAs 0004 to 0009, and when the job execution ends, the LBAs 0004 to 0009 are overwritten and erased.

For example, in a case where settings indicated by hatched buttons are selected in FIG. 4, zeros are written to the above-described LBAs 0004 to 0009 one time during job execution to perform the erase-by-overwriting processing.

The erase-by-overwriting processing in the image forming apparatus 8 is described as above. In the erase-by-overwriting processing, in a case where the erasure with zeros is performed one time on the storage apparatus 24, about twice as much write processing as normal erasure processing is performed, and in a case where the erasure with random data is performed three times on the storage apparatus 24, about three times as much write processing as normal erasure processing is performed.

In a case where the storage apparatus 24 is a magnetic storage processing unit with little deterioration by writes, such as a hard disk, the amount of writes does not directly affect the life of the storage apparatus 24.

However, in a case where the storage apparatus 24 is a storage element such as an SSD, deterioration may occur depending on the number of writes or the number of erasures. A situation where the amount of writes corresponds to the life indicates that performing the erase-by-overwriting processing shortens the time by which the storage apparatus 24 is damaged. In other words, a long-life combination can be achieved by increasing the capacity of the storage apparatus 24 to a sufficient capacity to prevent the storage apparatus 24 from being damaged before the life of the image forming apparatus 8 ends.

However, as the capacity increases, the cost also increases. The present exemplary embodiment describes a method of overcoming such a trade-off.

Specifically, even in a case where the storage apparatus 24 including a semiconductor storage element with the amount of writes corresponding to the life is attached, whether the erase-by-overwriting processing is operable or settings thereof are changeable can be switched based on characteristics of the storage apparatus 24.

[Prevention of Erasing During Job in Copy Job]

Figure 5A:
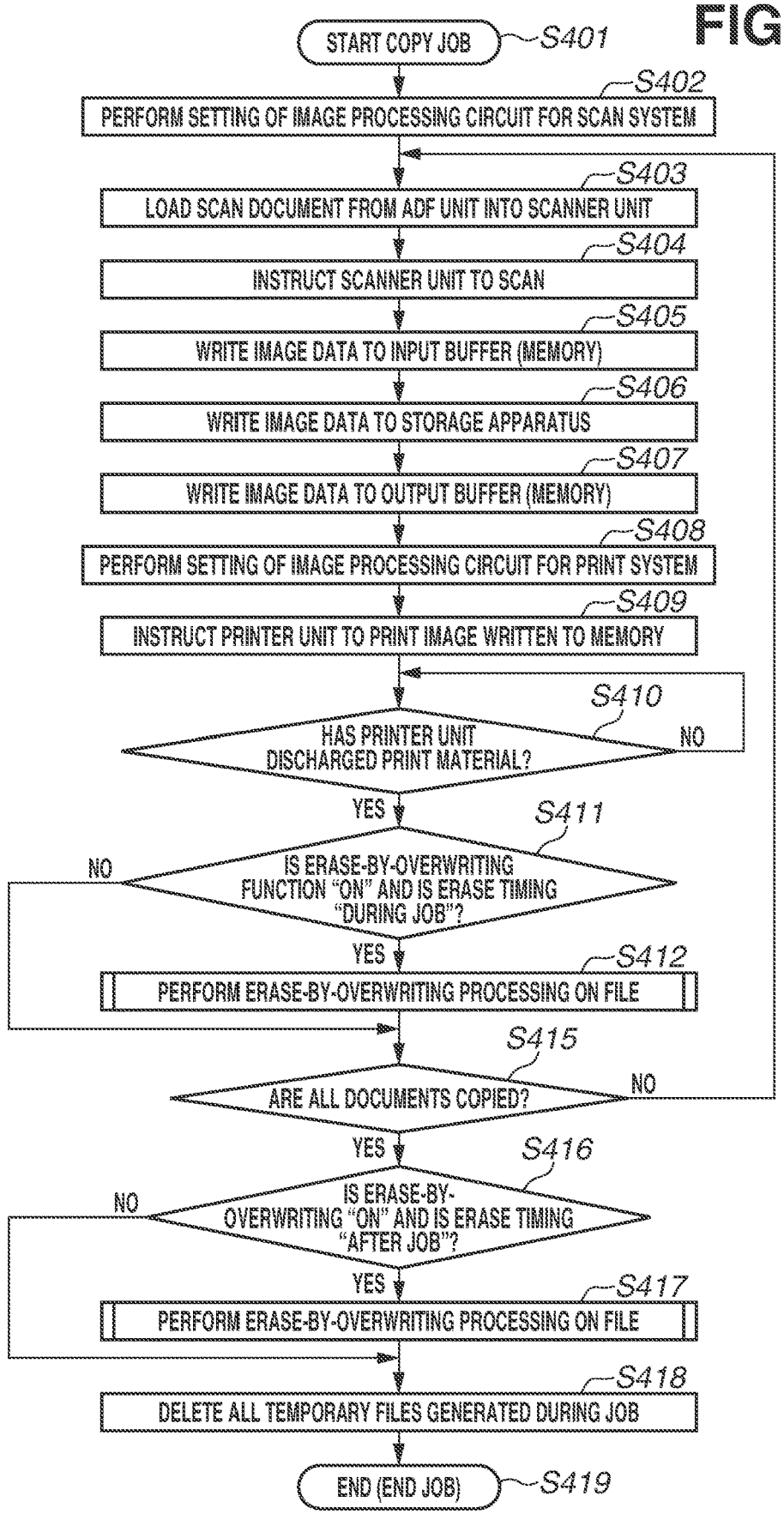

FIGS. 5A and 5B are flowcharts illustrating an erasure process during execution of a copy job. The flowcharts illustrated in FIGS. 5A and 5B are performed by the CPU 21 of the controller unit 1.

Figure 6:
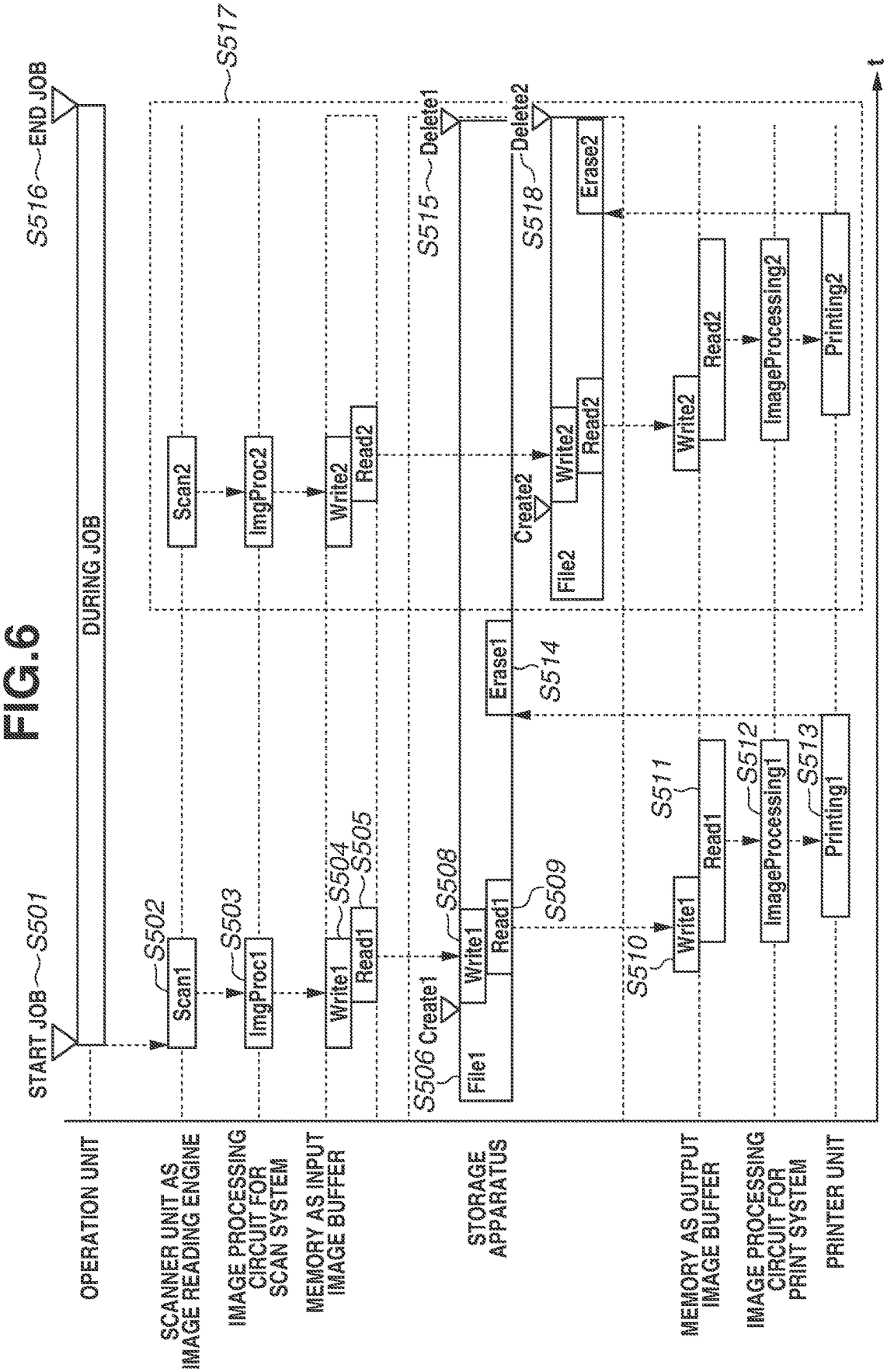
FIG. 6 is a time chart illustrating a copy job operation and erase-by-overwriting processing.

In step S401 in FIG. 5A, a copy job process illustrated in FIG. 5A is started if a user places, for example, two documents on the ADF unit 10 and presses the job start button 32 on a copy screen (not illustrated) on the operation panel 27. FIG. 6 is a time chart illustrating a data flow in the flowchart in FIG. 5A and operations on the storage apparatus 24.

In step 402, the CPU 21 performs a setting of the image processing circuit 29.

In step S403, the CPU 21 loads a document from the ADF unit 10 into the scanner unit 2.

In step S404, the CPU 21 instructs the scanner unit 2 to perform scanning. The CPU 21 performs step S502 so that the scanner unit 2 scans a first document, and the first document is optically scanned and converted into digital image data.

In step S405, the CPU 21 performs step S503 to perform real-time image processing and performs step S504 to write image data to the memory 22.

In step S406, the CPU 21 performs step S506 to write image data to the storage apparatus 24 to generate a file 1 on the storage apparatus 24. The CPU 21 performs step S505 to read the image data from the memory 22 and performs step S508 to sequentially write a real data portion of the file 1 to the storage apparatus 24. Thus, a process from the document reading to the image accumulation on the storage apparatus 24 ends.

Next, a process of printing the image stored in the storage apparatus 24 is performed. In step S407, the CPU 21 performs step S510 to write the image data to the memory 22, which is an output buffer. Then, in step S408, the CPU 21 performs a setting of the image processing circuit 30.

In step S409, the CPU 21 instructs the printer unit 3 to print the image data written to the memory 22. If the printer unit 3 operates, the CPU 21 performs step S511 to read the image from the memory 22 in synchronization with a polygon operation signal from the printer unit 3. The CPU 21 performs step S512 to perform image processing on the read image data, performs step S513 to transmit the image data to the printer unit 3 and print the image data, and discharges the print material onto the sheet discharge tray 7 of the image forming apparatus 8.

In step S410, the CPU 21 waits until the printer unit 3 discharges the print material. In a case where the discharge ends and the number of copies to make is one, the data in the file 1 to which the first document is written generated in step S506 is no longer necessary.

In step S411, in a case where the ON button 305 is selected as the erase-by-overwriting function 302 and the ERASE DURING JOB button 309 is selected as the erase timing 304 in FIG. 3 (YES in step S411), the processing proceeds to step S412. In step S412, the CPU 21 performs erase-by-overwriting processing on the file.

Details of step S412 are illustrated in FIG. 5B. Since the erase-by-overwriting processing is a subroutine, a process of step S420 is performed in step S412.

In step S421, the CPU 21 determines whether the storage apparatus 24 is a device that has a life consumed by writes or a device that uses a semiconductor storage apparatus. In the present exemplary embodiment, an HDD is described as a device using a semiconductor storage apparatus having a life that is not consumed by writes, and an SSD is described as a device using a semiconductor storage apparatus having a life that is consumed by writes. For example, the CPU 21 acquires Self-Monitoring, Analysis, and Reporting Technology (SMART) information from the storage apparatus 24 and determines the storage type based on whether the SMART information includes HDD-specific information such as the number of disk rotations.

In step S422, in a case where the storage apparatus 24 is an SSD, the size of the storage apparatus 24 is acquired. In step S423, whether the size of the storage apparatus 24 is larger than or equal to a predefined size (threshold value) is determined. In a case where the storage size is smaller than the predefined size and there is a life risk (NO in step S423), the subroutine ends without performing the erase-by-overwriting processing on the file, and the processing proceeds to step S415.

On the other hand, in a case where the storage size is larger than or equal to the predefined size (YES in step S423), the processing proceeds to step S424. In step S424, the CPU 21 performs step S514 to perform the erase-by-overwriting processing based on the set erase-by-overwriting method 303.

In a case where the ERASE WITH ZEROS ONE TIME button 307 is selected as the erase-by-overwriting method 303 in FIG. 4 (YES in step S424), the processing proceeds to step S425. In step S425, the CPU 21 performs step S514 to overwrite the file with zeros one time by the file size from the beginning of the file (the beginning of the LBA 805). After step S425 ends, the subroutine ends, and the processing proceeds to step S415.

On the other hand, in a case where the ERASE WITH RANDOM DATA THREE TIMES button 308 is selected as the erase-by-overwriting method 303 in FIG. 4 (NO in step S424), the processing proceeds to step S426. In step S426, the CPU 21 performs step S514 to overwrite the file with random data three times by the file size from the beginning of the file. After step S426 ends, the subroutine ends, and the processing proceeds to step S415.

In step S415, the CPU 21 checks whether there is a next document. In a case where there is a document to be scanned (NO in step S415), the CPU 21 reads a next document from the ADF unit 10 and performs step S517 to repeat the process similar to that described above.

On the other hand, in step S415, in a case where there is no more document to be scanned, i.e., in a case where all documents are copied (YES in step S415), the processing proceeds to step S416.

In step S416, the CPU 21 checks whether the ON button 305 is selected as the erase-by-overwriting method 303 and an ERASE AFTER JOB button 310 is selected as the erase timing 304 in FIG. 4. In a case where the ERASE AFTER JOB button 310 in FIG. 4 is selected (YES in step S416), the processing proceeds to step S417. In step S417, the CPU 21 performs the erase-by-overwriting processing. In step S417, the erase-by-overwriting processing based on the flowchart illustrated in FIG. 5B is also performed. In a case where the erase-by-overwriting processing is performed in step S412, the erase-by-overwriting processing is not performed in step S417. In a case where the erase-by-overwriting processing is performed in step S417, the erase-by-overwriting processing is not performed in step S412.

In a case where the ERASE AFTER JOB button 310 is not selected (NO in step S416), or in a case where the subroutine illustrated in FIG. 5B ends in step S417, the processing proceeds to step S418. In step S418, the CPU 21 performs steps S515 and S518 to delete the files 1 and 2 that are all the files accumulated in the storage apparatus 24, and in step S419, the copy job ends.

The erase-by-overwriting method 303 in step S514 used in the present exemplary embodiment does not relate directly to the present exemplary embodiment according to the disclosure. Thus, two representative types are described. The present exemplary embodiment is not intended to limit the number of erasures and the erasure method to those described in the present exemplary embodiment. For example, the number of erasures can be nine, or five erasure methods can be selectable.

Further, there are at least two SSD capacities, i.e., a nominal value of a recording apparatus that can be acquired by IdentifyDevice and a size that includes a redundant area of internal storage elements. There is a highly-reliable product with an understated nominal value to increase reliability of the SSD and with an increased redundant area by including a large number of storage elements. The present exemplary embodiment is directed to the determination of whether the remaining life of the SSD is enough, so that a similar advantage is obtained regardless of whether a nominal size or an internal storage element size is used as the storage size in the determination.

Further, in a case where the storage apparatus 24 is connected to a high-grade I/F, various types of information such as a device name and a self-test result such as a device size are acquired using the IdentifyDevice. Since a substantial device size can be identified from the device name without referring to the device size, whether the storage capacity is large or small can be determined based on the device name Specifically, step S422 can be modified to "acquire the device name and identify the capacity based on the device name" so that the present exemplary embodiment becomes applicable to a storage apparatus from which capacity information cannot be acquired.

The record of the erase-by-overwriting setting made on the screen illustrated in FIG. 4 is stored in an erase-by-overwriting setting 28 in the non-volatile memory 25. The erase-by-overwriting setting 28 is stored on a different device so that the stored setting values will not be damaged even in a case where the storage apparatus 24 is damaged.

Next, a modified example of the first exemplary embodiment will be described below. While the process illustrated in FIG. 5B is described as the erase-by-overwriting processing in step S420 in the first exemplary embodiment, the erase-by-overwriting processing is not limited to that described above. Other examples of the erase-by-overwriting processing in step S420 will be described below with reference to FIGS. 7A, 7B, and 7C. Each configuration similar to that in FIG. 5B is indicated by the same reference numeral, and a redundant description thereof is omitted.

First, FIG. 7A will be described. In step S904 in FIG. 7A, whether the storage is large-capacity or small-capacity is determined. In step S904, in a case where the storage size is large (YES in step S904), the processing proceeds to step S424 as in FIG. 5B. On the other hand, in a case where the storage size is small (NO in step S904), the processing proceeds to step S425, and in step S425, the CPU 21 overwrites the file with zeros one time by the file size.

With the above-described configuration, a situation where erasing is performed three times to significantly consume the life in a case where the storage capacity is small is prevented.

Figure 7B:
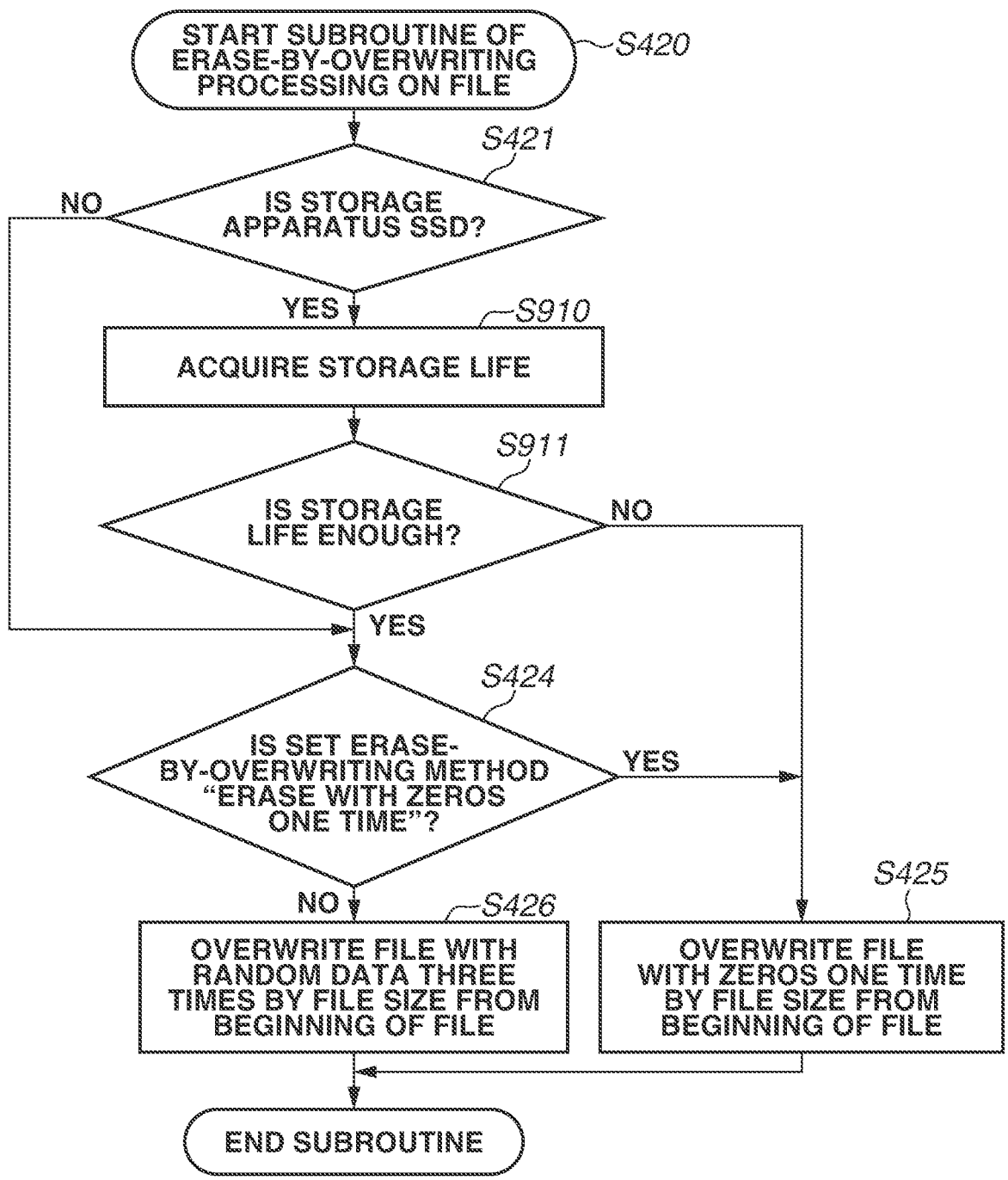

Next, FIG. 7B will be described below. FIG. 7B illustrates a case where the CPU 21 determines that a large amount of writes is not desirable based on life information recorded in the statistical information 804 about the storage apparatus 24. Specifically, in this method, the determination is dynamically performed based on statistical information about the current state of the storage apparatus 24. Since this process is significantly similar to step S904, only a difference will be described below.

First, FIG. 7B will be described below.

In step S421, in a case where the storage apparatus 24 is an SSD (YES in step S421), in step S910, the CPU 21 acquires the life of the storage apparatus 24. The life of the storage apparatus 24 corresponds to the number of remaining erasable blocks and the number of blocks having undergone alternative processing that are recorded in the statistical information 804 about the storage apparatus 24.

While the life of the storage element is described as being consumed by writes, what consumes the life thereof is technically the number of erasures. A NAND device, for example, is to be erased in order to perform writing. There is a definition of life with respect to the erasing. Since the inside of the storage element is controlled in blocks, the life can be acquired as the number of erasable blocks, an erasable size, or a writable data size.

Further, in a case where the storage element deteriorates and more retries are needed in reading, processing is performed to separate a block so that the separated block will not be used. The number of separated blocks can be acquired as the number of blocks having undergone alternative processing from the statistical information 804.

Performing the alternative processing consumes the capacity of the storage element 803, but in a case where the capacity is larger than the nominal value of the storage apparatus 24, the storage apparatus 24 is determined as being normal. In a case where the amount of sectors having undergone the alternative processing is larger than or equal to a predetermined amount, it is determined that reliability of storage elements manufactured by the same semiconductor manufacture process has decreased.

In step S910, the life information about the storage apparatus 24 is acquired, and in step S911, the CPU 21 determines whether the remaining life of the storage apparatus 24 is enough. Specifically, the life information and a prestored threshold value are compared. In a case where the life is larger than or equal to the threshold value (the life is enough) (YES in step S911), the processing proceeds to step S424. On the other hand, in a case where the life is less than the threshold value (the life is not enough) (NO in step S911), the processing proceeds to step S425. Specifically, in step S911, in a case where the CPU 21 determines that the remaining life is not enough, the ERASE WITH ZEROS ONE TIME button 307 is forcibly selected without referring to the erase-by-overwriting method 303, and the erase-by-overwriting processing ends.

While the writing with zeros one time is selected in step S425, the data does not have to be zeros. What consumes the life is to overwrite a plurality of times. Thus, forcibly changing the setting of overwriting a plurality of times to the setting of writing one time in a case where the setting of overwriting the plurality of times is made produces the same effect.

In step S911, in a case where the CPU 21 determines that the remaining life of the storage apparatus 24 is not enough, the subroutine can be ended without performing the erase-by-overwriting processing as in the case where the capacity is small in step S423 in FIG. 5B. This case is illustrated in FIG. 7C.

In step S914 in FIG. 7C, in a case where the CPU 21 determines that the life of the storage apparatus 24 is not enough (NO in step S914), the process ends. In particular, in a case where a Smart Return Status where the storage apparatus 24 provides a notification that the life of the storage apparatus 24 is about to end is enabled, in one embodiment, the storage apparatus 24 is immediately replaced and does not perform the erase-by-overwriting processing. Further, for example, an SSD replacement request message can be issued to prompt the user to replace the storage apparatus 24.

According to the flowchart illustrated in FIG. 7B, an operation of erasing one time or an operation of not performing erasing can be determined for an attached SSD with a short remaining life.

A background of a situation where the number of erases by overwriting is set to a large number as in step S426 is as follows.

A parameter of the number of erasures is received from a previous apparatus and a large number of erasures is set.

A large number of erasures is remotely set to plurality of image forming apparatuses 8 via the network.

An HDD is replaced by an SSD in a state where operation is performed using the HDD. Even in the above-described cases where a large number of erasures by overwriting is unintentionally set, wasteful consumption of the life of the SSD is prevented.

While representative examples of predetermined conditions are described in the first exemplary embodiment, the below-described combinations of control can be selected and implemented as needed in all patterns. There are four variations of life risks (small SSD capacity, large amount of writes) of the SSD (controllable in 4×2=8 patterns). The variations will be described below.

A. The erase-by-overwriting processing is changed based on whether the nominal capacity of the SSD is large or small.

The nominal capacity is a storage capacity that can be acquired from the storage apparatus 24 during a process of recognizing the storage apparatus 24. An example is a storage size that can be acquired using the IdentifyDevice. As the storage size, an upper limit of supported addresses of the LBA 805, which is equivalent to the maximum number of sectors, can be acquired. For example, in the case of a 300-GB SSD, the size is calculated to be slightly above 300 GB. In a case where the nominal capacity is larger or smaller than a predefined value, application of the present exemplary embodiment prevents or avoids a premature failure in the SSD even in a case where the erase-by-overwriting processing is enabled.

B. The erase-by-overwriting processing is changed based on whether the capacity of the storage element 803 of the SSD is large or small.

The capacity of the storage element 803 is a capacity including a spare block of the semiconductor storage element. In a case where the capacity of the SSD becomes less than a nominal value A, the SSD does not satisfy product specifications. Further, there is a case where the storage element 803 may deteriorate as a result of writing and may no longer be used. Thus, the SSD includes an internal spare block, controls a block determined as being weakened and being no longer usable to be not used and to be replaced by the spare block, so that the capacity is controlled to be not lower than the nominal value A. In other words, from the point of view of life, the greater the number of spare blocks is, the longer the life of the SSD is extended.

The spare blocks are prepared for two purposes of use. First, in order to increase reliability in writing a large amount of data to the SSD, for example, when the SSD is used as a server, a great number of spare blocks are included although this increases production costs.

Second, a great number of spare blocks are purposely installed in a product with a nominal value less than the capacity of a NAND storage element that can be produced most inexpensively. For example, a 1-TB storage element is the most inexpensively manufactured storage element. Then, in a case where it is determined that an inexpensive 300-GB SSD is needed on a product lineup, a product is manufactured by clipping so that the nominal value A is 300 GB when the storage element has the capacity of 1 TB. The 700-GB extra space is allocated to the spare blocks. As described above, the nominal value of the SSD is not equal to the amount of storage element.

The number of spare blocks can be acquired using not the IdentifyDevice command but a SMART command or a vendor-unique command. The present exemplary embodiment is applied in a case where the number of spare blocks is greater or less than a predefined value or in a case where the total of the nominal value A and the number of spare blocks is greater or less than the predefined value. Application of the present exemplary embodiment prevents or avoids a premature failure in the SSD even in a case where the erase-by-overwriting processing is enabled.

C. The life of the statistical information 804 about the SSD is predicted, and the erase-by-overwriting processing is changed based on whether the remaining life is long or short.

The statistical information 804 about the SSD is information such as an erase count and the number of spare blocks that can be acquired using the SMART command, a vendor command, or a vendor-unique command.

In many cases, the erase count is the number of erasures of the NAND storage element in design. In the present exemplary embodiment, the phrase "writes consume the life" is more precisely described as "in writing, first, erasing is performed, and then writing is performed, and the erasing consumes the life".

For example, in a case where the predefined number of erasures of the NAND storage element is 3000, as the NAND storage element is used, the erase count gradually increases. For example, in a case where the erase count is 1500, it can be determined that 50% of a designed life value is reached. There are a case where the number of times is acquired using the SMART command and the life is calculated by the user and a case where the percentage of the life calculated from the erase count is directly acquired using the SMART command. The numerical value is approximately the designed life value.

The number of spare blocks has been described above in the variation B. The number of erasures of the NAND storage element is evenly controlled by wear leveling described above, and the life of the NAND storage element is evenly consumed. Specifically, in a case where the number of spare blocks is greater than a predetermined number, it is expected that other NAND storage elements are overused to have a short remaining life. When there are no more spare blocks and the storage capacity becomes less than the nominal value A, a malfunction occurs. The number is approximately the current actual life.

Application of the present exemplary embodiment in a case where the theoretical life or the actual life is greater or less than a predefined value prevents or avoids a premature failure in the SSD even in a case where the erase-by-overwriting processing is enabled.

D. The erase-by-overwriting processing is changed based on whether the storage capacity obtained from a SSD name is large or small.

From the SSD name, the device name can be acquired using the IdentifyDevice. In a case where the device is not an SSD but an inexpensive non-volatile memory such as an embedded MultiMediaCard (eMMC), the device may not support an advanced data acquisition command, and it may sometimes be difficult to dynamically collect information from the storage apparatus 24 to apply the present exemplary embodiment.

Since the image forming apparatus 8 is an embedded device, the life and durability of a non-volatile memory or a storage apparatus that satisfies an employment condition are evaluated and then the non-volatile memory or the storage apparatus is employed. Thus, how much longer the life of the storage apparatus 24 is than the life of the image forming apparatus 8 is known at the time of employment.

For example, if what is called the name of the storage apparatus 24 such as a chip name, a chip identification (chip ID), a device identification (device ID), or a vendor identification (vendor ID) that allows the CPU 21 to determine what the storage apparatus 24 is acquired, the life of the currently-attached storage apparatus 24 is also acquired.

Application of the present exemplary embodiment in a case where the name is referred to and is a specific name prevents or avoids a premature failure in the SSD even in a case where the erase-by-overwriting processing is enabled.

The configuration of the present exemplary embodiment is applicable to any device with a life that is consumed by writes. For example, an HDD that includes an internal semiconductor storage apparatus as a temporary cache deteriorates in the semiconductor device portion. In such a case, whether the HDD is a life-consuming device can be determined based on the model number of the HDD to apply the aspect of the embodiments.

In the first exemplary embodiment, the method of preventing erase-by-overwriting processing during and after job operation is described. In a second exemplary embodiment, a method of preventing an erase-by-overwriting setting by screen operation on the erase-by-overwriting setting screen (FIG. 4) will be described.

Figure 8:
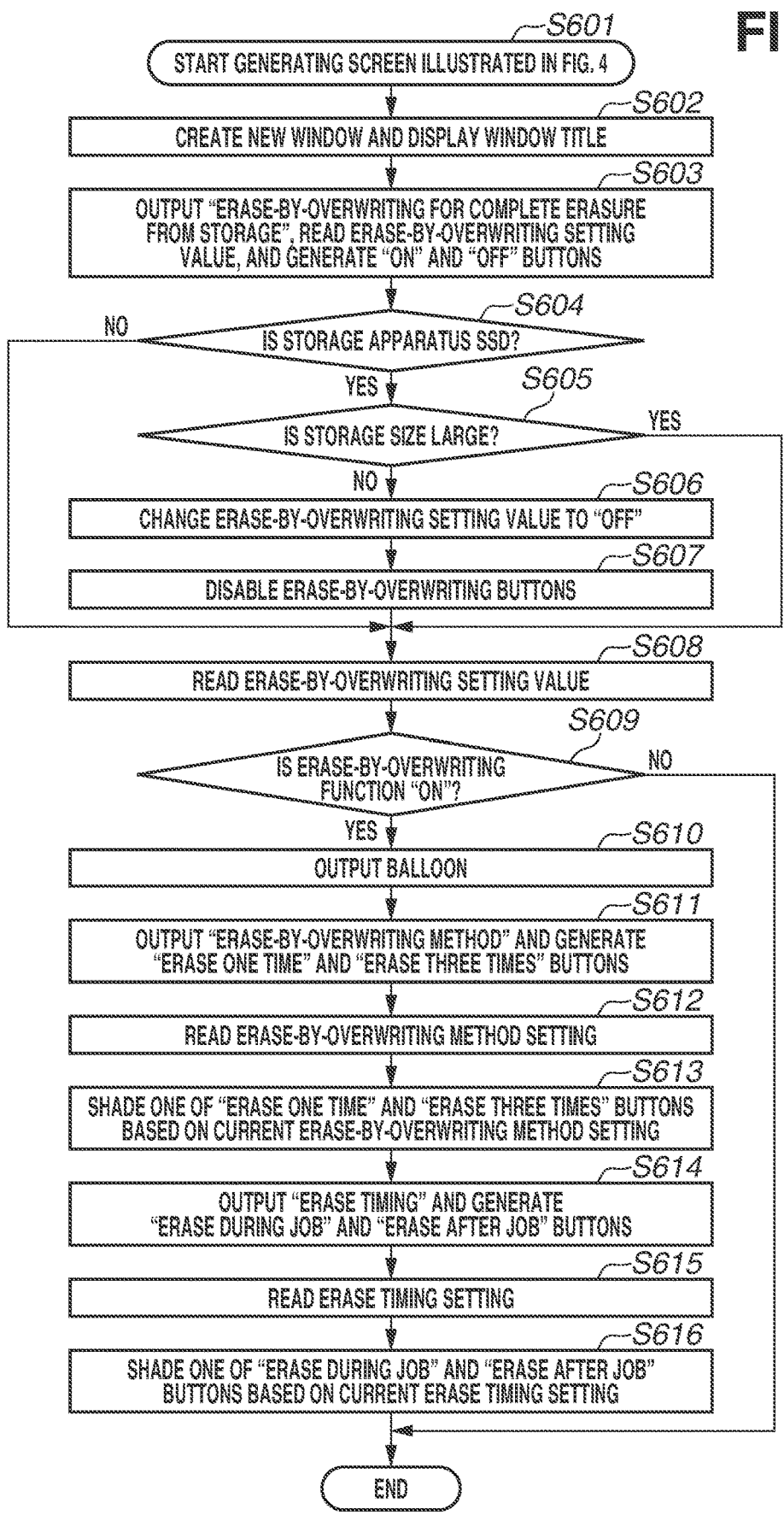
FIG. 8 is a flowchart illustrating a process of displaying the erase-by-overwriting setting screen (FIG. 4).

FIG. 8 illustrates a process of displaying the erase-by-overwriting setting screen (FIG. 4).

In a case where a user operates the operation panel 27 to set the erase-by-overwriting setting, the screen in FIG. 4 is displayed.

At this time, the CPU 21 performs a process of step S601 to draw the erase-by-overwriting setting screen (FIG. 4) on the operation panel 27.

In step S602, the CPU 21 creates a new window on the operation panel 27 in FIG. 4 and draws a window title.

In step S603, the CPU 21 draws ERASE-BY-OVERWRITING FOR COMPLETE ERASE OF STORAGE, reads the currently-set erase-by-overwriting setting value from the non-volatile memory 25, and generates the ON and OFF buttons 305 and 306.

In step S604, the CPU 21 checks whether the storage apparatus 24 is an HDD or an SSD.

In step S604, in a case where the storage apparatus 24 is an HDD (NO in step S604), the drawing of an erase-by-overwriting field ends, and a next field is displayed.

In step S608, the CPU 21 reads the erase-by-overwriting setting value. In step S609, in a case where the ON button 305 is selected as the erase-by-overwriting function 302 (YES in step S609), the processing proceeds to step S610. In step S610, the CPU 21 draws the balloon item 311 on the screen.

In step S611, the CPU 21 draws the ERASE-BY-OVERWRITING METHOD 303 on the screen and generates the ERASE WITH ZEROS ONE TIME button 307 and the ERASE WITH RANDOM DATA THREE TIMES button 308. In step S612, the CPU 21 reads the current settings. In step S613, the CPU 21 shades the selected button.

In step S614, similarly, the CPU 21 draws the ERASE TIMING 304 on the screen and generates the ERASE DURING JOB button 309 and the ERASE AFTER JOB button 310. Then, in step S615, the CPU 21 reads the current settings. In step S616, the CPU 21 shades the selected button.

While an example of the erase-by-overwriting setting screen that further displays detailed specifications as to how and when to erase the storage in the balloon item 311 in a case where the ON button 305 is selected for the erase-by-overwriting method 303 has been described, the present exemplary embodiment is not limited to the example described herein.

Referring back to step S604, in a case where the storage apparatus 24 is an SSD (YES in step S604), the processing proceeds to step S605. In step S605, the CPU 21 acquires the storage size from the storage apparatus 24. In a case where the size is sufficiently large (YES in step S605), the processing proceeds to step S608. Then, the subsequent control similar to that in the case of the HDD described above is performed. The phrase "similar to that in the case of the HDD" indicates that the user can select the ON button 305 and also all the setting items in the balloon item 311.

In step S605, in a case where the SSD size is small (NO in step S605), the processing proceeds to step S606. In step S606, the CPU 21 forcibly changes the erase-by-overwriting setting value to OFF and disables the ON and OFF buttons 305 and 306, which are buttons to change the erase-by-overwriting function 302.

Figure 9:
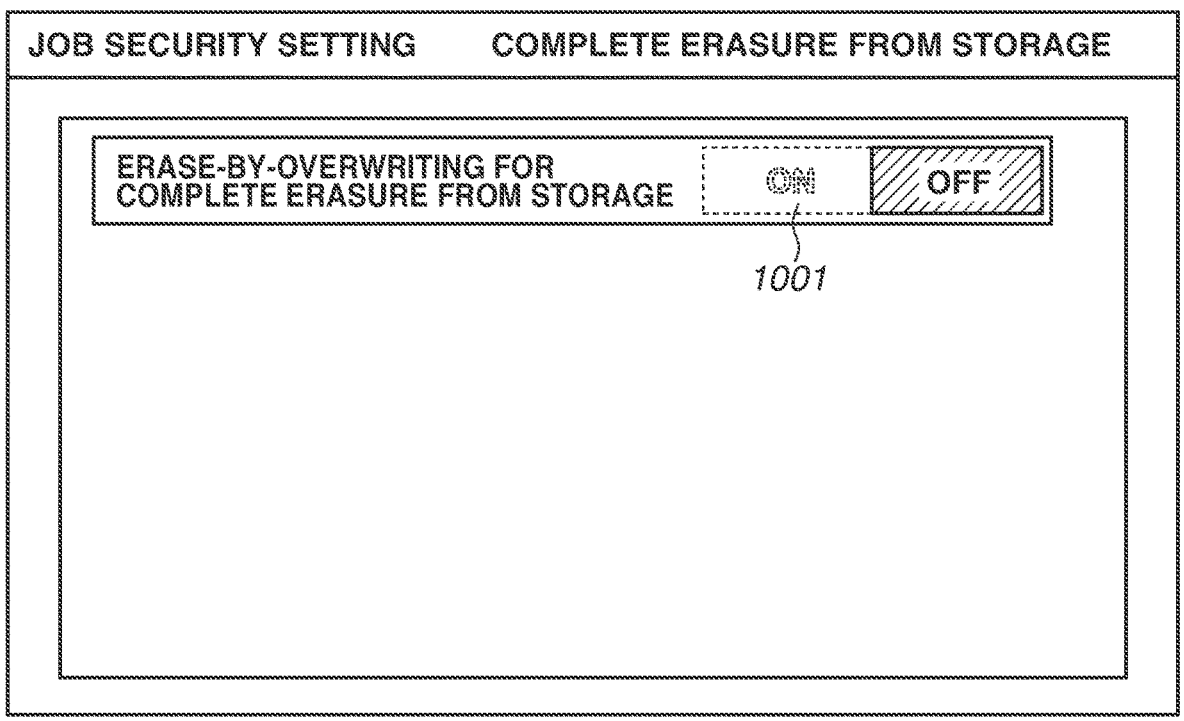
FIG. 9 illustrates an example of a screen on which the erase-by-overwriting setting is disabled.

In a case where the capacity of the SSD is small, a screen illustrated in FIG. 9 is displayed. On the screen in FIG. 9, the erase-by-overwriting setting is displayed as OFF, and nothing can be changed. In the state where the setting is limited, an ON button 1001 is disabled, and the erase-by-overwriting setting cannot be changed to ON. While the example is described in which the setting is disabled by displaying the corresponding button in a light color and in a non-pressable state, the present exemplary embodiment is not limited to the example described herein.

The display process in FIG. 8 illustrates a method of controlling whether to enable the setting of the erase-by-overwriting function 302 based on whether the storage size is large or small. Alternatively, the control can be performed based on the life as described above.

Further, while whether to enable the setting of the erase-by-overwriting function 302 is described above, the control as in steps S425 and S426 in FIGS. 7A, 7B, and 7C can be performed. Specifically, for example, in a case where the SSD has a life risk, the ON and OFF buttons 305 and 306 of the erase-by-overwriting function 302 are set operable, whereas the ERASE WITH RANDOM DATA THREE TIMES button 308 of the erase-by-overwriting method 303 is disabled. Consequently, the ERASE WITH ZEROS ONE TIME button 307 is selectable in a case where the life risk of the SSD occurs or in a case where the capacity of the SSD is small.

While several representative examples are described above in the second exemplary embodiment, the below-described combinations of control can be selected and implemented as needed in all patterns.

There are four variations of control of erasure of the SSD by overwriting.

A. The screen display and control are restrained based on whether the nominal capacity of the SSD is large or small.
B. The screen display and control are restrained based on whether the capacity of the storage element 803 of the SSD is large or small.
C. The screen display and control are restrained by predicting the life of the statistical information 804 and determining whether the remaining life of the SSD is long or short.
D. The screen display and control are restrained based on whether the storage capacity acquired from the SSD name is large or small There are two variations of restraining screen display and control.

1. The OFF button 306 is automatically selected and displayed whereas the ON button 305 is controlled to not be pressed.

2. The ERASE WITH ZEROS ONE TIME button 307 is automatically selected and displayed whereas the ERASE WITH RANDOM DATA THREE TIMES button 308 is controlled to not be pressed.

In the second exemplary embodiment, unless the erase-by-overwriting setting screen in FIG. 4 is opened, the erase-by-overwriting setting is not changed to OFF. Thus, the erase-by-overwriting setting 28 can be updated when the image forming apparatus 8 is activated.

FIG. 10 illustrates a sequence of activating the image forming apparatus 8.

If the power switch 26 is turned on, the CPU 21 performs a process of step S701.

In step S702, the CPU 21 first initializes the operation unit 4. The operation panel 27 displays "ACTIVATING".

In step S703, the CPU 21 turns on the scanner unit 2. Further, the CPU 21 initializes the image processing circuit 29.

In step S704, the CPU 21 turns on the printer unit 3. Further, the CPU 21 initializes the image processing circuit 30. In step S705, the CPU 21 initializes the network.

After the initialization of peripheral circuits is completed, in step S706, the CPU 21 acquires the size of the storage apparatus 24. In step S711, in a case where the storage apparatus 24 is an HDD (NO in step S711), the processing proceeds to step S710. In a case where the storage apparatus 24 is an SSD (YES in step S711), the processing proceeds to step S706. In step S706, in a case where the storage size is large (YES in step S706), the processing proceeds to step S710. In a case where the storage size is small (NO in step S706), the processing proceeds to step S707. In step S707, the CPU 21 reads the value of the erase-by-overwriting setting 28 from the non-volatile memory 25.

In step S708, the CPU 21 changes the value of the erase-by-overwriting setting 28 to OFF. In step S709, the CPU 21 stores the value of the erase-by-overwriting setting 28 in the non-volatile memory 25. Then, in step S710, the CPU 21 displays an activation end screen on the operation panel 27 and ends activation.

As described above, in a case where the erase-by-overwriting setting 28 that is not acceptable to a connected storage device is set when the image forming apparatus 8 is activated, the CPU 21 changes the set value to a value that is acceptable to the storage apparatus.

For example, in a case where the content of an HDD is copied to an SSD and replaced by the SSD in a state where the HDD is previously attached to the storage apparatus 24 and the setting of erasing three times is set, the setting value can be changed to an acceptable setting value at the next activation.

While various examples and exemplary embodiments of the disclosure are described above, the spirit and scope of the disclosure is not to be limited by a specific description in the present specification.

OTHER EMBODIMENTS

Embodiment(s) of the disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2020-114215, filed Jul. 1, 2020, which is hereby incorporated by reference herein in its entirety.

What is claimed is:

1. An apparatus that includes a non-volatile semiconductor storage apparatus, the apparatus comprising a controller configured to make a setting of an erase-by-overwriting function of issuing an instruction to erase data stored in the semiconductor storage apparatus by overwriting the stored data with different data, wherein, in a case where the semiconductor storage apparatus satisfies a predetermined condition, the controller enables the setting of the erase-by-overwriting function to be made, wherein, in a case where the semiconductor storage apparatus does not satisfy the predetermined condition, the controller disables the setting of the erase-by-overwriting function to be made, wherein the controller determines whether a storage size of the semiconductor storage apparatus is larger than or equal to a threshold value, and wherein, in a case where the storage size is larger than or equal to the threshold value, the predetermined condition is satisfied, whereas in a case where the storage size is less than the threshold value, the predetermined condition is not satisfied.

2. The apparatus according to claim 1, wherein the controller acquires the storage size of the semiconductor storage apparatus using a first command, and wherein the controller determines whether the storage size is larger than or equal to the threshold value.

3. The apparatus according to claim 1, wherein the controller acquires a storage size of the semiconductor storage apparatus using a first command and acquires a storage size of the semiconductor storage apparatus using a second command, and wherein the controller determines whether a total storage size of the storage size corresponding to the first command and the storage size corresponding to the second command is larger than or equal to the threshold value.

4. The apparatus according to claim 1, wherein the erase-by-overwriting function is a function of issuing an instruction to erase the data stored in the semiconductor storage apparatus by overwriting the stored data with the different data based on completion of a job based on the data stored in the semiconductor storage apparatus.

5. The apparatus according to claim 1, wherein the erase-by-overwriting function is a function of issuing an instruction to erase read data among the data stored in the semiconductor storage apparatus by overwriting the read data with the different data during execution of a job based on the data stored in the semiconductor storage apparatus.

6. The apparatus according to claim 1, further comprising a printer configured to print image data on a recording medium,
wherein the data stored in the semiconductor storage apparatus is the image data for use in printing by the printer.

7. The apparatus according to claim 1, wherein the semiconductor storage apparatus is a solid state drive (SSD).

8. The apparatus according to claim 1,
wherein the erase-by-overwriting function includes a first erase-by-overwriting function of erasing the data by overwriting the data a plurality of times based on a single erase-by-overwriting instruction and a second erase-by-overwriting function of erasing the data by overwriting the data a single time based on a single erase-by-overwriting instruction,
wherein, in a case where the semiconductor storage apparatus satisfies the predetermined condition, the controller enables the setting of the first erase-by-overwriting function or the setting of the second erase-by-overwriting function to be made, and
wherein, in a case where the semiconductor storage apparatus does not satisfy the predetermined condition, the controller disables the setting of the first erase-by-overwriting function to be made and enables the setting of the second erase-by-overwriting function to be made.

9. The apparatus according to claim 8, further comprising an operation unit configured to receive user operation,
wherein, in a case where the semiconductor storage apparatus satisfies the predetermined condition, the setting of the first erase-by-overwriting function and the setting of the second erase-by-overwriting function are enabled to be made on the operation unit, whereas in a case where the semiconductor storage apparatus does not satisfy the predetermined condition, the setting of the first erase-by-overwriting function is disabled to be made and the setting of the second erase-by-overwriting function is enabled to be made on the operation unit.

10. An apparatus that includes a non-volatile semiconductor storage apparatus, the apparatus comprising a controller configured to make a setting of an erase-by-overwriting function of issuing an instruction to erase data stored in the semiconductor storage apparatus by overwriting the stored data with different data,
wherein, in a case where the semiconductor storage apparatus satisfies a predetermined condition, the controller enables the setting of the erase-by-overwriting function to be made,
wherein, in a case where the semiconductor storage apparatus does not satisfy the predetermined condition, the controller disables the setting of the erase-by-overwriting function to be made,
wherein the controller acquires statistical information about the semiconductor storage apparatus,
wherein the controller determines whether the acquired statistical information is larger than or equal to a threshold value, and
wherein, in a case where the statistical information is larger than or equal to the threshold value, the predetermined condition is satisfied, whereas in a case where the statistical information is less than the threshold value, the predetermined condition is not satisfied.

11. The apparatus according to claim 10, wherein the statistical information is information about a number of data erasures from the semiconductor storage apparatus or a number of spare blocks of a storage element of the semiconductor storage apparatus.

12. The apparatus according to claim 11, further comprising an operation unit configured to receive a selection made by a user,
wherein, in a case where the semiconductor storage apparatus satisfies the predetermined condition, the setting of the erase-by-overwriting function is enabled to be made on the operation unit, whereas in a case where the semiconductor storage apparatus does not satisfy the predetermined condition, the setting of the erase-by-overwriting function is disabled to be made on the operation unit.

13. The apparatus according to claim 12, wherein, in a case where the semiconductor storage apparatus does not satisfy the predetermined condition at activation of the information processing apparatus, the operation unit displays a screen that prompts a change of the setting of the erase-by-overwriting function on the display unit.

14. A method of controlling an apparatus that includes a non-volatile semiconductor storage apparatus, the method comprising:
checking whether the semiconductor storage apparatus satisfies a predetermined condition;
enabling a setting of an erase-by-overwriting function of issuing an instruction to erase data stored in the semiconductor storage apparatus by overwriting the stored data with different data to be made in a case where the semiconductor storage apparatus satisfies the predetermined condition, and disabling the setting of the erase-by-overwriting function to be made in a case where the semiconductor storage apparatus does not satisfy the predetermined condition; and
determining whether a storage size of the semiconductor storage apparatus is larger than or equal to a threshold value,
wherein, in a case where the storage size is larger than or equal to the threshold value, the predetermined condition is satisfied, whereas in a case where the storage size is less than the threshold value, the predetermined condition is not satisfied.

15. The method according to claim 14, further comprising:
acquiring statistical information about the semiconductor storage apparatus; and
determining whether the acquired statistical information is larger than or equal to a threshold value,
wherein, in a case where the statistical information is larger than or equal to the threshold value, the predetermined condition is satisfied, whereas in a case where the statistical information is less than the threshold value, the predetermined condition is not satisfied.

16. A non-transitory computer-readable storage medium storing a program for causing a computer to execute a method, the method comprising:
- checking whether the semiconductor storage apparatus satisfies a predetermined condition;
- enabling a setting of an erase-by-overwriting function of issuing an instruction to erase data stored in the semiconductor storage apparatus by overwriting the stored data with different data to be made in a case where the semiconductor storage apparatus satisfies the predetermined condition, and disabling the setting of the erase-by-overwriting function to be made in a case where the semiconductor storage apparatus does not satisfy the predetermined condition; and
- determining whether a storage size of the semiconductor storage apparatus is larger than or equal to a threshold value,
- wherein, in a case where the storage size is larger than or equal to the threshold value, the predetermined condition is satisfied, whereas in a case where the storage size is less than the threshold value, the predetermined condition is not satisfied.

17. The non-transitory computer-readable storage medium according to claim 16, further comprising:
- acquiring statistical information about the semiconductor storage apparatus; and
- determining whether the acquired statistical information is larger than or equal to a threshold value,
- wherein, in a case where the statistical information is larger than or equal to the threshold value, the predetermined condition is satisfied, whereas in a case where the statistical information is less than the threshold value, the predetermined condition is not satisfied.

* * * * *